United States Patent
Devilliers et al.

(10) Patent No.: US 12,529,965 B2
(45) Date of Patent: Jan. 20, 2026

(54) METHOD FOR SELECTIVE EXPOSURE OF WAFER TO CORRECTIVE IRRADIATION AT A PER-DIE LEVEL

(71) Applicant: Tokyo Electron Limited, Tokyo (JP)

(72) Inventors: Anton J. Devilliers, Clifton Park, NY (US); Daniel J. Fulford, Ballston Lake, NY (US); Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 101 days.

(21) Appl. No.: 18/426,879

(22) Filed: Jan. 30, 2024

(65) Prior Publication Data
US 2025/0244680 A1    Jul. 31, 2025

(51) Int. Cl.
*G03F 7/20* (2006.01)
*G03F 7/00* (2006.01)

(52) U.S. Cl.
CPC ...... *G03F 7/70466* (2013.01); *G03F 7/70025* (2013.01); *G03F 7/70141* (2013.01); *G03F 7/70358* (2013.01)

(58) Field of Classification Search
CPC ............. G03F 7/70466; G03F 7/70025; G03F 7/70141; G03F 7/70358
See application file for complete search history.

(56) References Cited

U.S. PATENT DOCUMENTS

| | | | |
|---|---|---|---|
| 9,645,391 B2 | 5/2017 | Devilliers et al. | |
| 9,645,495 B2 | 5/2017 | Devilliers | |
| 9,646,898 B2 | 5/2017 | Devilliers et al. | |
| 9,977,339 B2 | 5/2018 | Devilliers et al. | |
| 10,551,743 B2 | 2/2020 | Carcasi et al. | |
| 11,360,388 B2 | 6/2022 | Devilliers et al. | |
| 2009/0040480 A1* | 2/2009 | Kawashima | G03F 7/70425 355/53 |
| 2024/0004300 A1* | 1/2024 | Tsai | H10B 12/482 |

OTHER PUBLICATIONS

International Search Report and Written Opinion of the International Searching Authority issued Apr. 2, 2025 in PCT/US2024/061031, 10 pages.

* cited by examiner

*Primary Examiner* — Mesfin T Asfaw
(74) *Attorney, Agent, or Firm* — Oblon, McClelland, Maier & Neustadt, L.L.P.

(57) ABSTRACT

A method of processing a substrate, including forming a photomask based on a layout of a first surface of a wafer including at least one opaque region and at least one transparent region and the first surface of the wafer being coated with a photosensitive resist; providing the photomask at a first photomask location between the first surface of the wafer and a source of radiation at a predetermined wavelength, the at least one opaque region of the photomask covering a first region of the first surface of the wafer and the at least one transparent region of the photomask exposing a second region of the first surface of the wafer; and exposing the first surface of wafer to a first pattern of radiation, the first pattern of radiation including the second region of the wafer exposed by the at least one transparent region of the photomask.

20 Claims, 11 Drawing Sheets

METHOD FOR SELECTIVE EXPOSURE OF WAFER TO CORRECTIVE IRRADIATION AT A PER-DIE LEVEL

FIELD OF THE INVENTION

This disclosure relates generally to methods of microfabrication, and more specifically to photolithography.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called exposure tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation.

It can be desired to expose a single wafer to a pattern of light that includes varying exposure doses of radiation in order to achieve features of different sizes.

SUMMARY

In one embodiment, the present disclosure relates to a method of processing a substrate, the method comprising forming a photomask based on a layout of a first surface of a wafer, the photomask including at least one opaque region and at least one transparent region and the first surface of the wafer being coated with a photosensitive resist; providing the photomask at a first photomask location between the first surface of the wafer and a source of radiation at a predetermined wavelength, the at least one opaque region of the photomask covering a first region of the first surface of the wafer and the at least one transparent region of the photomask exposing a second region of the first surface of the wafer; exposing the first surface of wafer to a first pattern of radiation at the predetermined wavelength, the first pattern of radiation including the second region of the wafer exposed by the at least one transparent region of the photomask; displacing the photomask to a second photomask location between the first surface of the wafer and the source of radiation, the at least one transparent region of the photomask exposing a third region of the first surface of the wafer when the photomask is at the second photomask location; and exposing the first surface of the wafer to a second pattern of radiation at the predetermined wavelength, the second pattern of radiation including the third region of the wafer exposed by the at least one transparent region of the photomask at the second photomask location.

In one embodiment, the present disclosure relates to a method of processing a substrate, the method comprising providing one or more overlapping structures at a first location between a first surface of a wafer and a source of radiation at a predetermined wavelength, the one or more overlapping structures forming an aperture, the aperture exposing a first region of the first surface of the wafer and the first surface of the wafer being coated with a photosensitive resist; exposing the first surface of the wafer to a first pattern of radiation at the predetermined wavelength, the first pattern of radiation including the first region of the first surface of the wafer; displacing the one or more mechanical blades to a second location between the first surface of the wafer and the source of radiation, the aperture exposing a second region of the first surface of the wafer when the one or more mechanical blades are at the second location; and exposing the first surface of the wafer to a second pattern of radiation at the predetermined wavelength, the second pattern of radiation including the second region of the first surface of the wafer.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

The present disclosure is related to techniques for selective exposure of a wafer to actinic radiation for development of photoresist on the wafer. Specifically, the systems and methods described herein can be used to control and adjust exposure of locations within a wafer to a radiation source in order to provide resolution enhancement and improve the precision of feature development and wafer bow correction. A location can be a point location, area, or region of the wafer. A region, as used herein, can be within a single die or can refer to an individual die or frame on a wafer. The selective exposure can be used to correct critical dimension (CD) variation of one or more features. In one embodiment, a CD signature of one or more patterned substrates can be generated representing a collection of CD variation maps for one or more substrates. Each substrate can have random and/or repeating variations. In some embodiments, a composite CD signature can be generated based on repeating variations. The CD signature can be used to provide light intensity values that can be used to correct non-uniformities at each coordinate location. In one embodiment, a correction exposure pattern can then be generated to correct the critical dimension variation. The correction exposure pattern can be exposed via component exposure, augmentation exposure, or partial exposure. It is important that the correction exposure is applied precisely to the wafer in order to prevent affecting any features that have already been developed with the correct critical dimensions.

Figure 1:
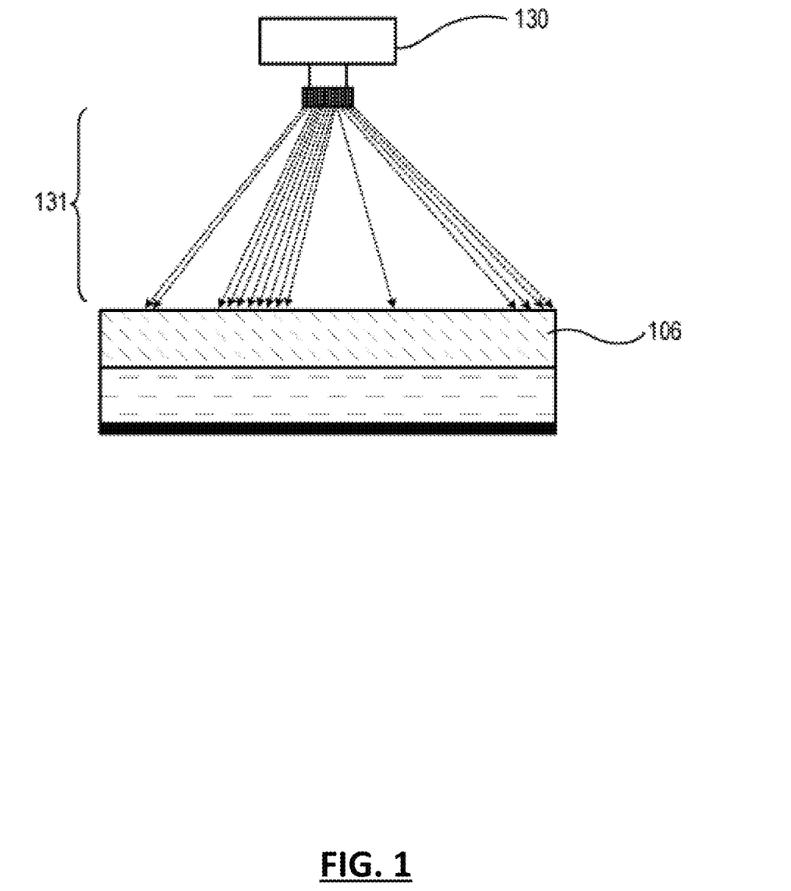
FIG. 1 is a cross-sectional view of an example direct write projection system, according to one embodiment of the present disclosure.

A wafer can be exposed to radiation using a scanner or stepper system or any similar tool that can steer a radiation source (e.g., a laser beam of actinic radiation at a predetermined wavelength) relative to the wafer. The laser beam can be used to scan and expose the wafer in discrete steps. In one embodiment, the correction exposure pattern can be applied to a wafer via a direct write system. The direct write system can increase the exposure at point locations where features are undersized and reduce or eliminate exposure at point locations where features are oversized according to the correction exposure pattern. The intensity of projection at any point location can be adjustable from zero actinic radiation to full exposure or any gradation of light intensity in between. FIG. 1 illustrates an example cross-sectional drawing of a direct write system 130. Pattern 131 (e.g., a correction exposure pattern) can be projected onto photoresist film 106. The pattern 131 can vary in amount of radiation per coordinate location based on a composite critical dimension signature.

Figure 2:
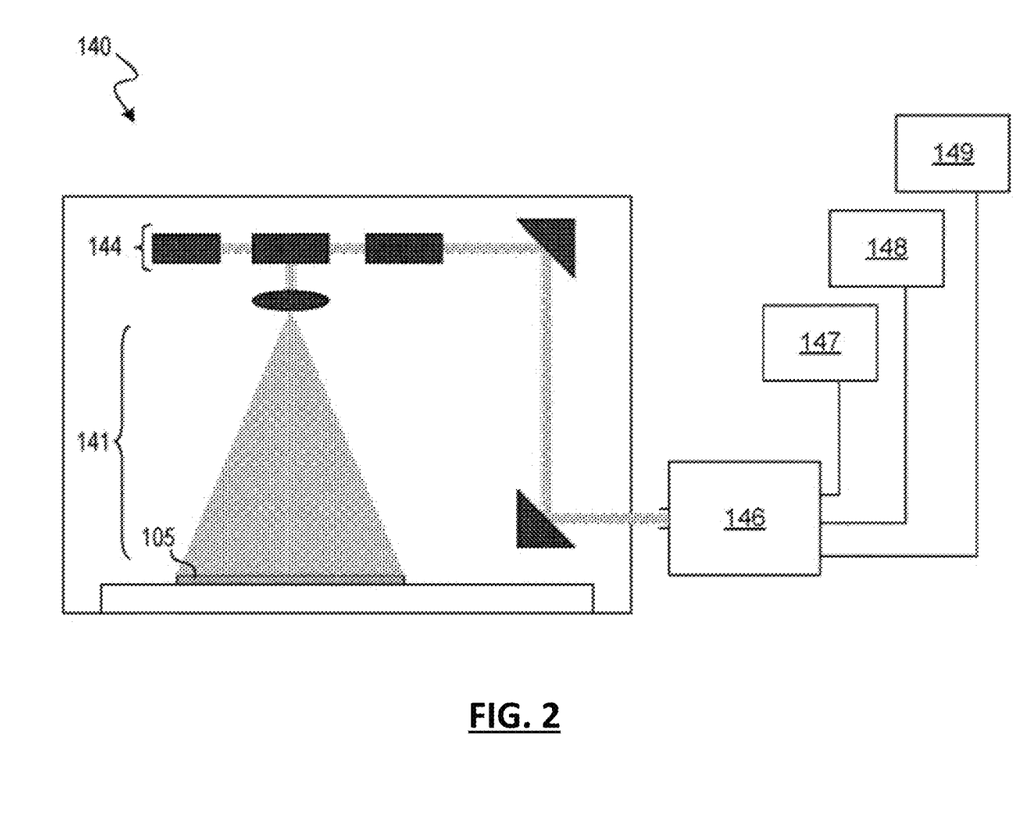
FIG. 2 is a schematic view of a mask-based photolithographic exposure system, according to one embodiment of the present disclosure.

FIG. 2 is an illustration of an exposure system 140 according to one embodiment of the present disclosure. The exposure system 140 can be a mask-based photolithographic exposure system such as a stepper or scanner. The exposure system 140 can have a higher spatial resolution as compared to the direct write system 130. Exposure system 140 can include optics 144 receiving light from light source 146 to project pattern 141, which can be a mask-based pattern. Input 147, input 148, and input 149 can include various gases, such as ArF, $N_2$, and helium for use by a given laser light source. Such exposures systems are conventionally known and so only a simplified description is provided here. Conventional mask-based systems commonly use 193 nm wavelength light, which can print feature sizes down to about 50 nm. Not all direct write systems can achieve that resolution or achieve that resolution efficiently. Resolutions of direct write systems can be limited to sizes of micro mirrors or beam sizes. Techniques herein, however, can combine both exposure systems to provide a combination maskless dynamic exposure and a mask-based pattern exposure to correct repeated patterns without measuring every substrate.

In embodiments in which multiple wavelength exposures occur, photoresist films can be formed that are sensitive to a first wavelength for the direct write exposure and yet sensitive to a second wavelength for a remaining or full mask-based exposure. Moreover, a type of agent sensitive to the radiation can optionally be selected to generate either an acid or a base on light exposure and/or be thermally sensitive so that the heat of white light or infrared, for example, can activate. Any combinations of actinic radiation can be used between the two exposure systems. Example wavelengths for combination exposures include 172 nm, 193 nm, 248 nm, 256 nm 365 nm, white light, and infrared light.

Figure 3:
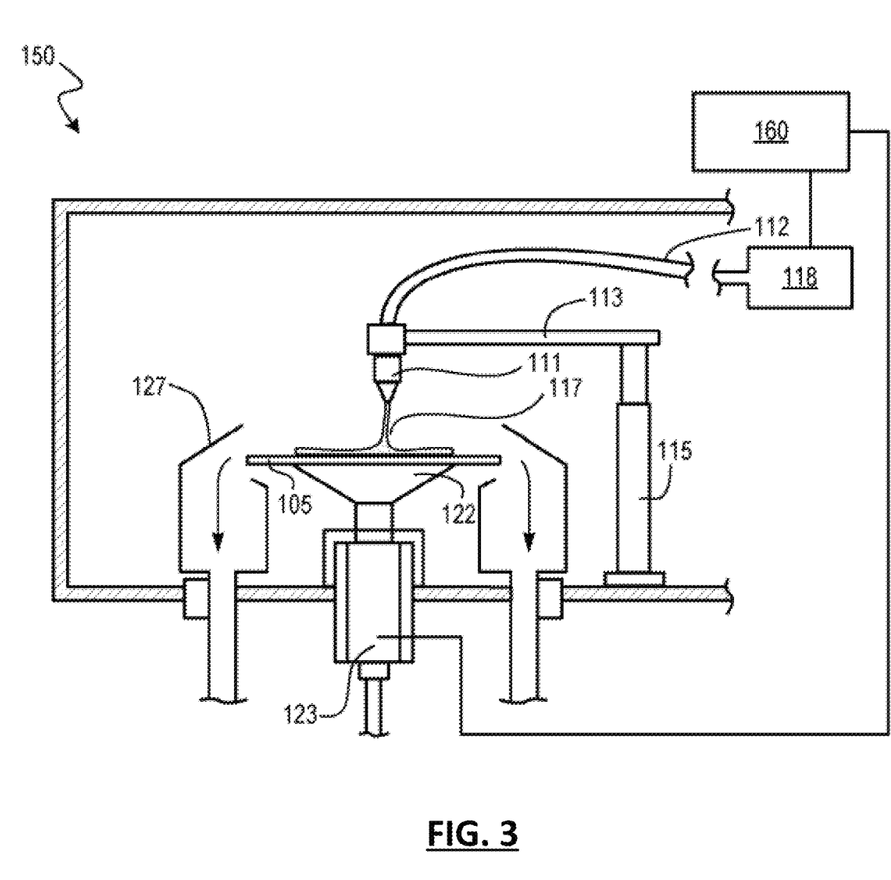
FIG. 3 is a cross-sectional schematic view of an example dispense system, according to one embodiment of the present disclosure.

FIG. 3 is an illustration of a coater-developer system 150 for exposing, developing, etching, and stripping substrates. A substrate can be coated with a photoresist film using coater-developer module 150 as a system for dispensing liquid on a substrate 105. Substrate holder 122 is configured to hold substrate 105 and rotate substrate 105 about an axis. Motor 123 can be used to rotate the substrate holder 122 at a selectable rotational velocity. A dispense unit 118 is configured to dispense liquid on a working surface of the substrate 105 while the substrate 105 is being rotated by the substrate holder 122. Dispense unit 118 can be positioned directly over a substrate holder, or can be positioned at another location. If positioned away from the substrate holder, than a conduit 112 can be used to deliver fluid to the substrate. The fluid can exit through nozzle 111. FIG. 3 illustrates liquid 117 being dispensed onto a working surface of substrate 105. Collection system 127 can then be used to catch or collect excess liquid 117 that spins off substrate 105 during a given dispense operation. Dispense components can include nozzle arm 113 as well as support member 115, which can be used to move a position of nozzle 111 across the substrate 105, or to be moved away from the substrate holder 122 to a resting location, such as for rest upon completion of dispense operations. The dispense unit 118 can alternatively be embodied as a nozzle itself. Such a nozzle can have one or more valves in communication with system controller 160. The dispense unit 118 can have various embodiments configured to control dispense of a selectable volume of fluid on a substrate, and to dispense combination of fluids.

Figure 4:
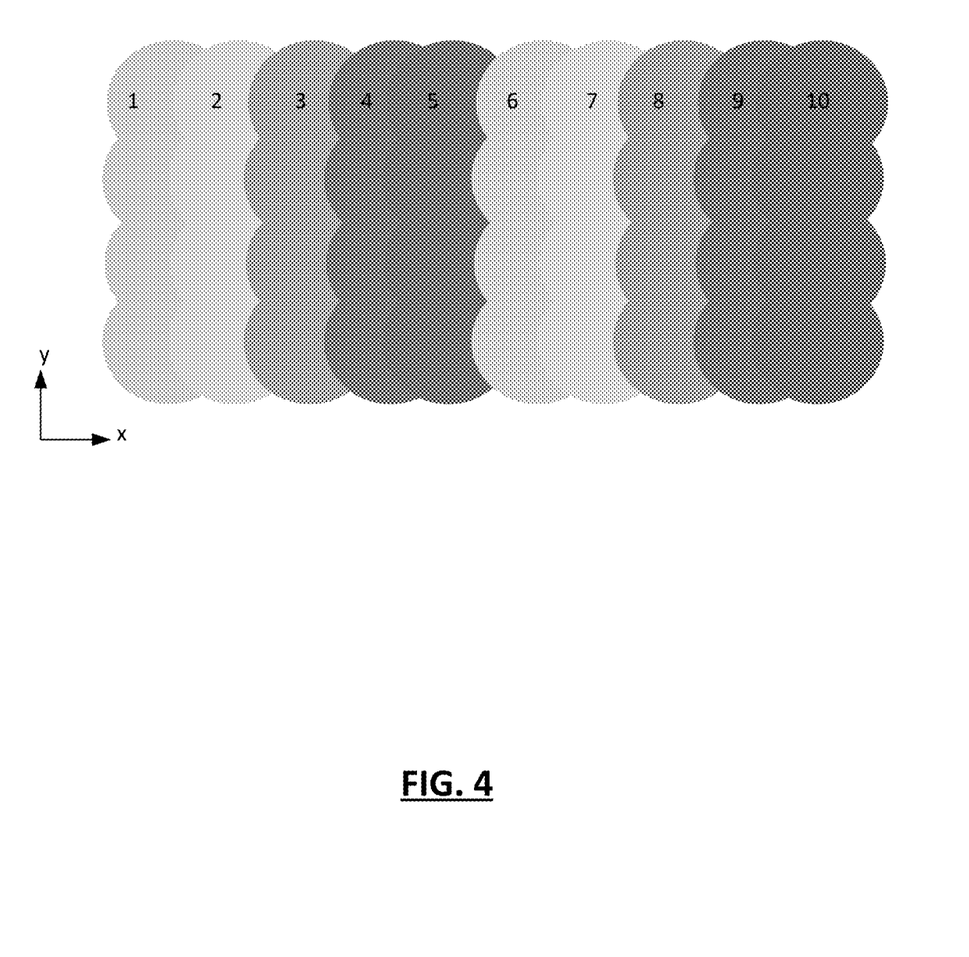
FIG. 4 is an illustration of a laser beam irradiation pattern, according to one embodiment of the present disclosure.

FIG. 4 is a top-down illustration of a laser beam pattern on a wafer. The pattern can be, for example, a correction pattern for correcting CD variation. Each circle represents a point of laser beam contact with the wafer. As an illustrative example, the laser beam can be approximately 3 mm in diameter. The stepper tool can move the laser beam by steps of approximately 0.5 mm. In an embodiment, the laser beam can move across the wafer in rows. For example, the first contact point 1 can be located at a top left corner of the wafer. The laser can be moved by 0.5 mm in the x-direction to generate the second contact point 2. The laser can be moved by 0.5 mm in the x-direction to generate the third contact point 3, etc. until the laser beam reaches the top right corner of the wafer at contact point 10. The number of laser beam contact points in a die can be a function of the dimensions of the die, the size of the beam, and the step size. The size of the laser beam and the stepping of the laser beam can be such that there is overlap between contact points on the wafer. In some embodiments, adjacent laser beams can irradiate overlapping regions. The radiation can accumulate, resulting in increased exposure of certain regions. In addition, the exposure dose of the laser beam can vary within a die. The exposure dose can be a function of the power of the laser beam and the exposure time. For example, a first region of a die can be exposed for longer than a second region of the die based on the features in each region.

In one example, a region of high exposure can be adjacent or in proximity to a region of low exposure on a wafer. In this case, it is important that the region of low exposure does not receive any of the exposure dose that is applied to the region of high exposure in order to maintain the critical dimensions (CDs) of features in the region of low exposure. Residual exposure from the region of high exposure can result in the CDs of features in surrounding regions being smaller than required. This effect can be especially prevalent in regions located at the transition between two adjacent dies. In general, overexposure or underexposure to radiation can affect the CDs of features in a die and can result in lower resolution or inaccurate development of features. The transition between regions of different exposures should be immediate such that radiation applied to a first region does not affect a second region and vice versa.

Described herein are systems and methods for selectively isolating and exposing regions of a wafer in order to control and correct the exposure dose delivered to the wafer on a per-die basis. The systems and methods described herein are compatible with the photolithography systems and techniques described with reference to FIG. 1, FIG. 2, and FIG. 3. In one embodiment, the methods of the present disclosure can improve the accuracy of wafer exposure and patterning in order to correct CD variation. The regions of the wafer can correspond to one or more dies having the same or different energy patterns. In an embodiment, a wafer can include a pattern of dies, wherein dies having the same energy pattern can be distributed across the wafer. The processes described herein can be implemented for patterning of wafers before or after a photolithography mask is applied to the wafer. In an embodiment, the processes described herein can be compatible with patterning of wafers used for extreme ultraviolet (EUV) lithography. The systems and methods for selectively isolating and exposing regions of a wafer to radiation, as presented herein, can be applied when the wafer is exposed to a laser beam via a stepper or similar tool that can steer the laser beam relative to the wafer.

The method for selectively isolating and exposing regions of a wafer can include applying a shield between the wafer and a radiation source during irradiation. In one embodiment, the shield can include one or more mechanical blades affixed over a wafer so that only a select region of the wafer is exposed to radiation (e.g., a laser beam). The one or more mechanical blades can refer to overlapping sheets or pieces of opaque material forming an aperture (opening) at the center. The mechanical blades can be similar in structure to the aperture blades of a lens. The one or more mechanical blades can be provided between the wafer and the laser beam source. The laser beam can irradiate a region of the wafer that is exposed through the at least one aperture of the one or more mechanical blades. The at least one aperture can be large enough that the laser beam can be stepped across the exposed region. As described previously, the exposed region can correspond to a wafer die.

The one or more mechanical blades can cover the remaining area of the wafer outside of the exposed region. In one embodiment, the one or more mechanical blades can be overlapping blades, and the amount of overlap of the blades can be adjusted to adjust the size of the aperture. For example, the position, orientation, or overlap of the one or more mechanical blades can be adjusted to change the size and/or shape of the aperture. Thus, the one or more mechanical blades can be used to set the size and/or shape of the exposed region that is visible through the aperture. In one embodiment, the one or more mechanical blades can be affixed above the wafer and closer to the wafer than to the laser beam source. The wafer can be moved relative to the one or more mechanical blades or vice versa in order to expose different regions through the aperture.

Figure 5A:
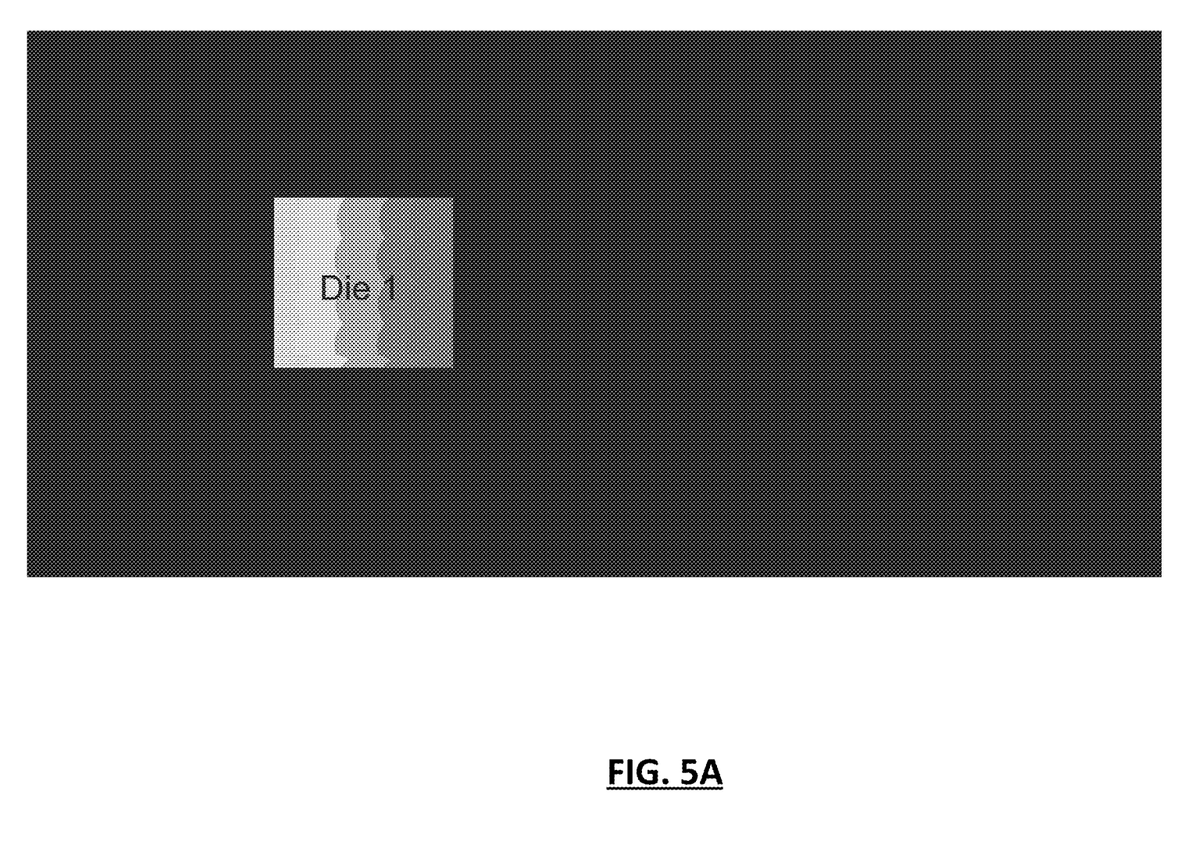
FIG. 5A is an illustration of a region of a wafer exposed by an aperture according to one embodiment of the present disclosure.

FIG. 5A is a top-down view of a wafer wherein a region of a wafer (Die 1) is exposed by the aperture of one or more mechanical blades. The region can be a single die, as illustrated in FIG. 5A. Alternative shapes and sizes of the aperture are compatible with the present disclosure. A laser beam can be stepped across Die 1 one or more times. For example, the laser beam can be stepped over the die a plurality of times in order to increase the delivered exposure dose. In an embodiment, the exposure dose applied by the laser beam can be adjusted between regions or within a region. For example, Die 1 can include a high exposure area and a low exposure area. The exposure of Die 1 can be adjusted during the stepping of the laser beam. The remaining area of the wafer outside of Die 1 is covered by the one or more mechanical blades. Therefore, any laser beam irradiation of the wafer is isolated to Die 1. Even when the laser beam reaches the edges of Die 1, any portion of the laser beam that extends past the edges of Die 1 will be blocked from reaching the wafer by the one or more mechanical blades.

Figure 5B:
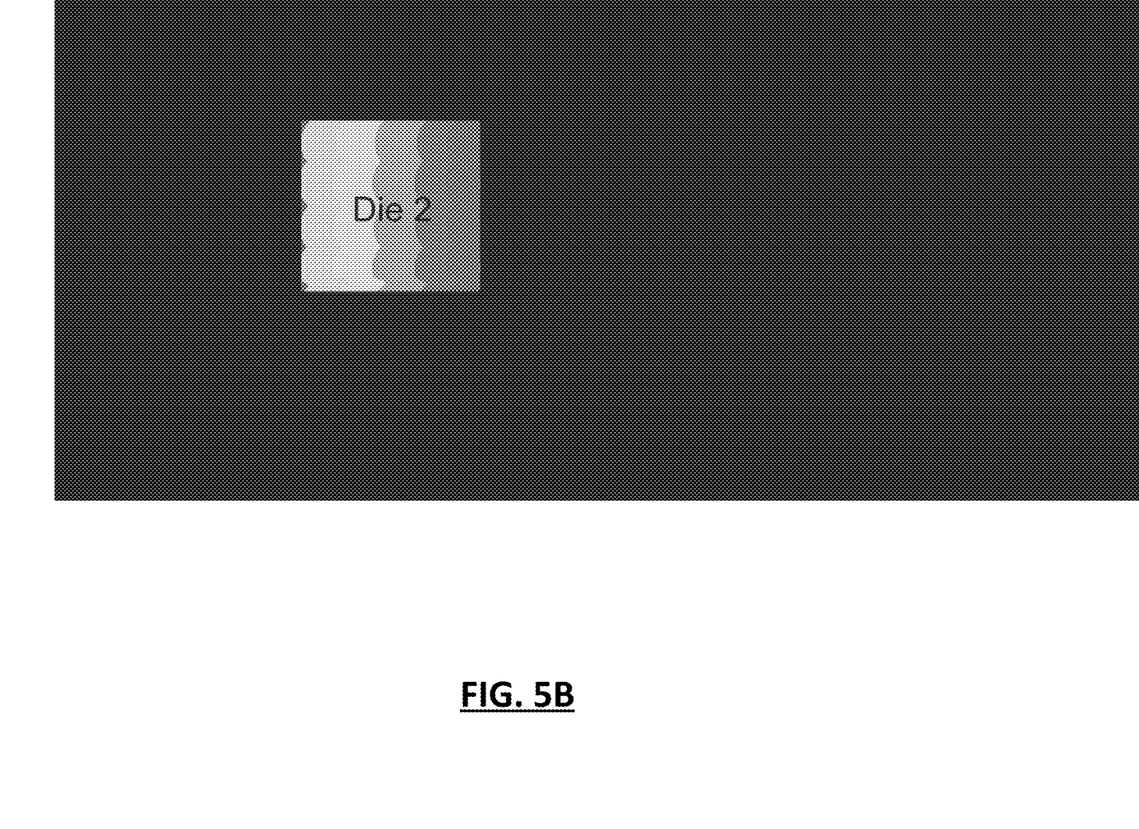
FIG. 5B is an illustration of a region of a wafer exposed by an aperture according to one embodiment of the present disclosure.

FIG. 5B is a top-down view of the wafer of FIG. 5A after the wafer has been displaced to expose a different region (Die 2) through the aperture of the one or more mechanical blades. In an embodiment, the one or more mechanical blades can be moved by a wafer stage while the wafer is stationary. The movement of the wafer stage can be programmed based on the die pattern of the wafer. In an embodiment, the wafer can be moved while the one or more mechanical blades are stationary. The laser beam can be stepped across Die 2 one or more times. For example, the laser beam can be stepped over the die a plurality of times in order to increase the delivered exposure dose. The energy pattern of Die 2 can be the same as or different from that of Die 1.

The mechanical blades can continue to be moved by the wafer stage to expose each die via the aperture. The stepping of the laser beam can be adjusted based on the size of the aperture. For example, the displacement of the laser beam can be limited to be within the aperture. In this manner, the laser beam can be applied to each die individually until all of the dies have been properly irradiated. In an embodiment, the exposure dose (e.g., exposure time) of the laser beam can be adjusted based on each die pattern. By exposing each die individually, the critical dimensions of features of each die can be accurately patterned without affecting surrounding dies. Any bow of each die can also be controlled and/or corrected individually.

It can be appreciated that the one or more mechanical blades are provided herein as a non-limiting example of a shielding structure that can cover a first region of a wafer while exposing a second region within an aperture. In one embodiment, a mask (e.g., photomask) can be applied over the wafer. The photomask can be an opaque mask including a pattern of apertures, the apertures being transparent regions or cutouts in the photomask. Radiation applied to the photomask can penetrate through the apertures while being blocked by the opaque regions. The pattern of the mask can be based on the layout of a wafer. The layout can refer to the number, size, spacing, and position of dies on a surface (e.g., the working surface) of the wafer. For example, the size of the apertures and the spacing between transparent regions can correspond to the size and spacing of dies on the wafer. A wafer can be positioned beneath the mask so that a die is exposed via each of the one or more apertures. In one embodiment, the mask can be provided between the wafer and the laser beam source and can be closer to the wafer than to the laser beam source. In one embodiment, the mask can include a single aperture to expose one die at a time in a similar manner to the one or more mechanical blades described herein. The mask can be displaced over the wafer (e.g., by a wafer stage) to expose die regions via the one or more apertures. The laser beam can be stepped across the one or more apertures in order to irradiate each exposed die.

In one embodiment, the mask can include a pattern of apertures to simultaneously expose a set of dies while covering remaining regions, including other dies, on the wafer. In one embodiment, the set of dies that are simultaneously exposed by the mask can be dies that are exposed to the same pattern or amount of radiation. In one embodiment, the set of dies that are simultaneously exposed by the mask can be dies that receive a corrective dose of radiation exposure. The corrective dose can correct for low exposure of the dies. In one embodiment, the corrective dose can be used to correct wafer bowing at the dies.

Figure 6A:
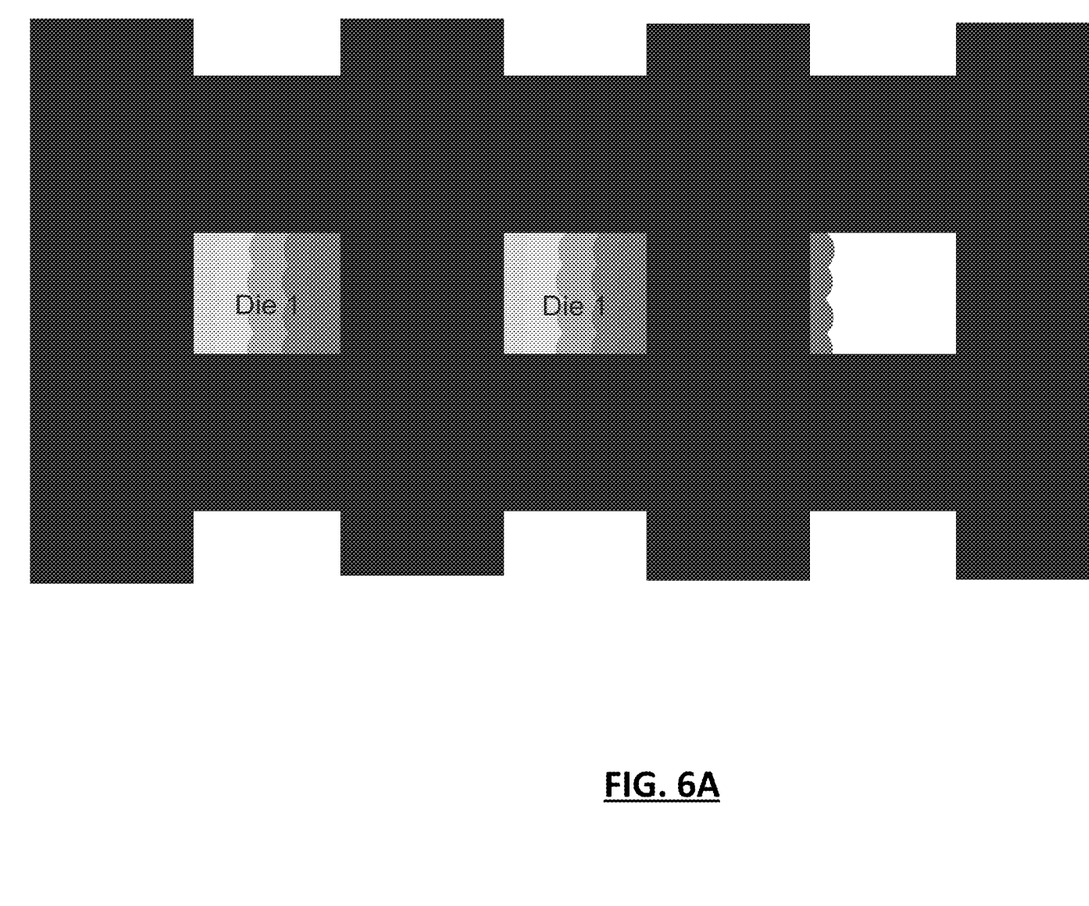
FIG. 6A is an illustration of a region of a wafer exposed by a photomask according to one embodiment of the present disclosure.

FIG. 6A is a top-down view of a wafer wherein a mask is layered over the wafer. As an example, the mask includes a grid pattern of apertures that expose a first set of dies (Die 1). In an embodiment, each of the first set of dies can be exposed to the same pattern of radiation. In another embodiment, the first set of dies can include dies that are exposed to different patterns of radiation. The mask can cover regions of the wafer outside of the first set of dies. A laser beam can be stepped across the wafer to irradiate each of the first set of dies in a first set of laser scans. A set of laser scans can include one or more scans of the laser beam over the die. For example, the laser beam can be stepped over the die a plurality of times in order to increase the delivered exposure dose. In one embodiment, the laser beam can be stepped across the wafer in rows. For example, the laser beam can be used to irradiate a first row of the first die in the first set of dies and then a first row of the second die in the first set of dies illustrated in FIG. 6A. The laser beam can then be used to irradiate a second row of the first die in the first set of dies and then a second row of the second die in the second set of dies illustrated in FIG. 6A.

Figure 6B:
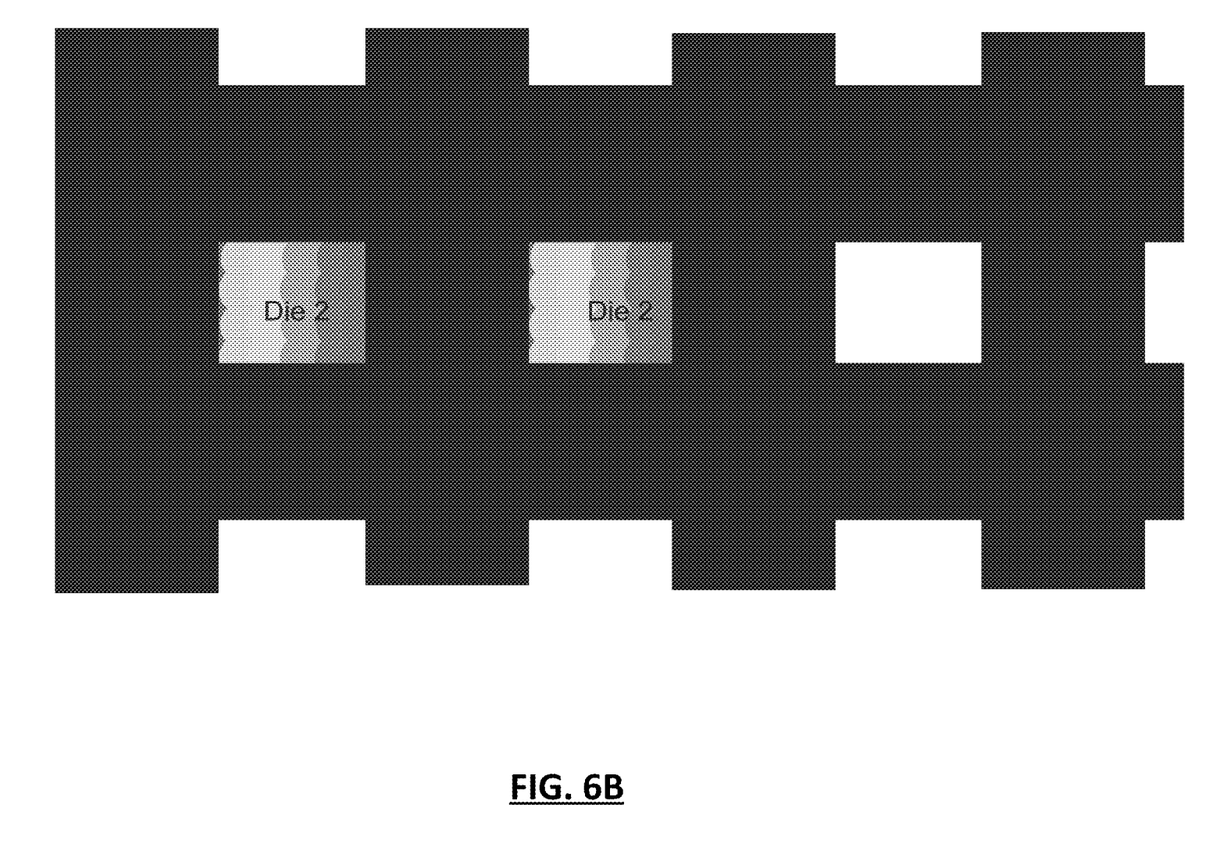
FIG. 6B is an illustration of a region of a wafer exposed by a photomask according to one embodiment of the present disclosure.

When the set of dies have been fully irradiated, the wafer stage can displace the mask relative to the wafer so that a new set of dies are exposed via the mask pattern. FIG. 6B is a top-down view of the wafer of FIG. 6A, wherein the mask has been shifted to the right. The displacement of the mask relative to the wafer can result in a new set of dies (a second set of dies (Die 2)) being exposed by the grid pattern of the mask. Each of the second set of dies can be exposed to the same pattern of radiation or different patterns of radiation. The displacement of the mask relative to the wafer, as illustrated in FIG. 6B, results in the first set of dies being covered by the opaque regions of the mask. Therefore, the first set of dies will no longer be exposed to radiation while the second set of dies is being irradiated. In this manner, the exposure dose of the first set of dies can be preserved while the second set of dies are irradiated. The laser beam can be stepped across the wafer to irradiate each of the second set of dies in a second set of laser scans.

Figure 6C:
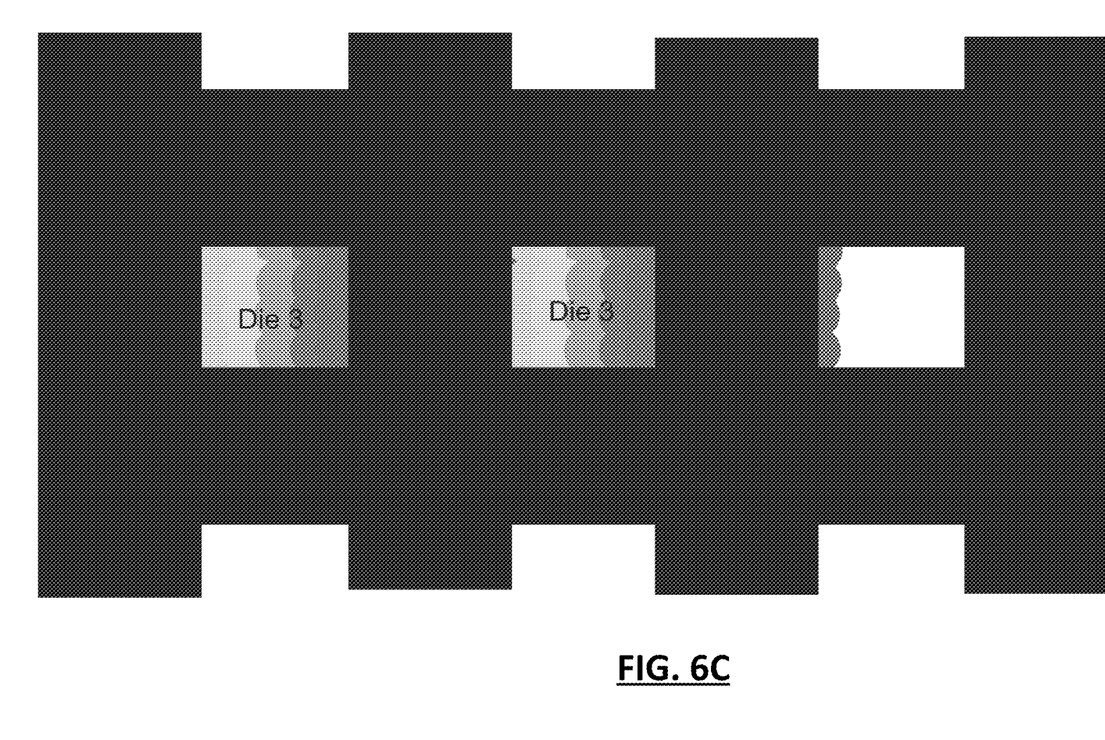
FIG. 6C is an illustration of a region of a wafer exposed by a photomask according to one embodiment of the present disclosure.

FIG. 6C is a top-down view of the wafer of FIG. 6A wherein the mask has been shifted downwards and to the left so that a third set of dies is exposed by the grid pattern of the mask. Other regions of the wafer, including the first set of dies and the second set of dies, are covered by the opaque regions of the mask. The laser beam can be stepped across the wafer to irradiate each of the third set of dies in a third set of laser scans.

Figure 6D:
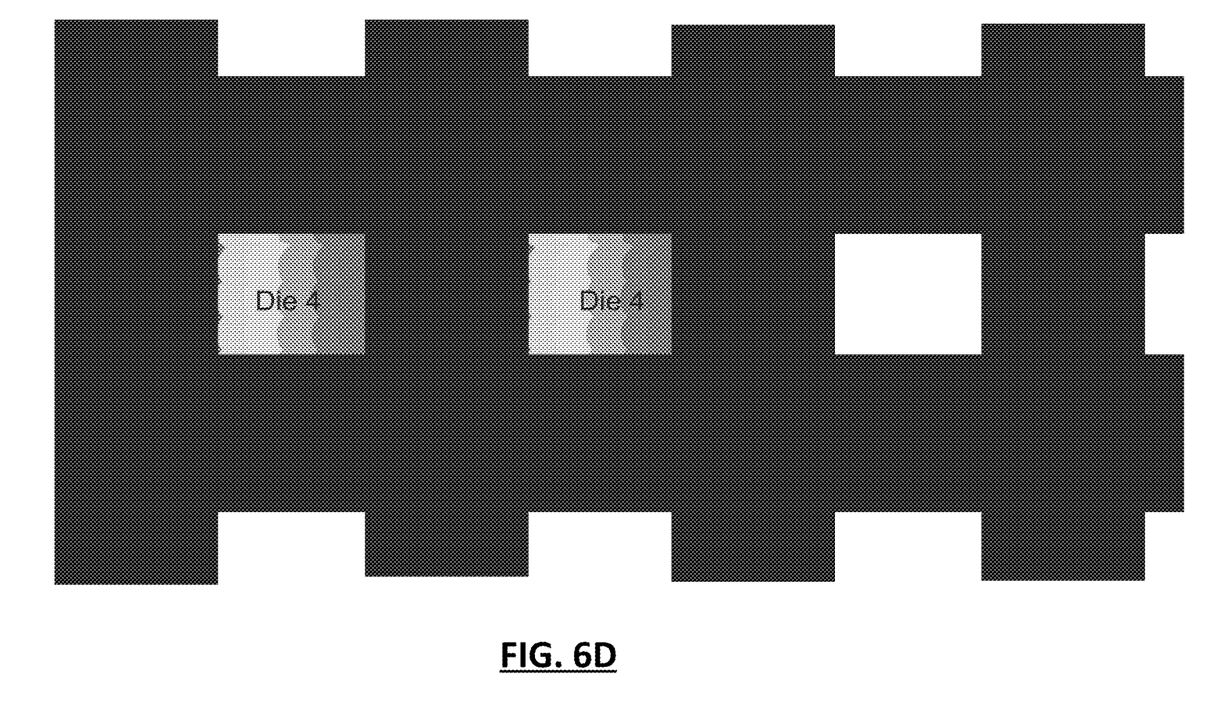
FIG. 6D is an illustration of a region of a wafer exposed by a photomask according to one embodiment of the present disclosure.

FIG. 6D is a top-down view of the wafer of FIG. 6A wherein the mask has been shifted to the right so that a fourth set of dies is exposed by the grid pattern of the mask. Other regions of the wafer, including the first, second, and third set of dies, are covered by the opaque regions of the mask. The laser beam can be stepped across the wafer to irradiate each of the fourth set of dies in a fourth set of laser scans.

Figure 7:
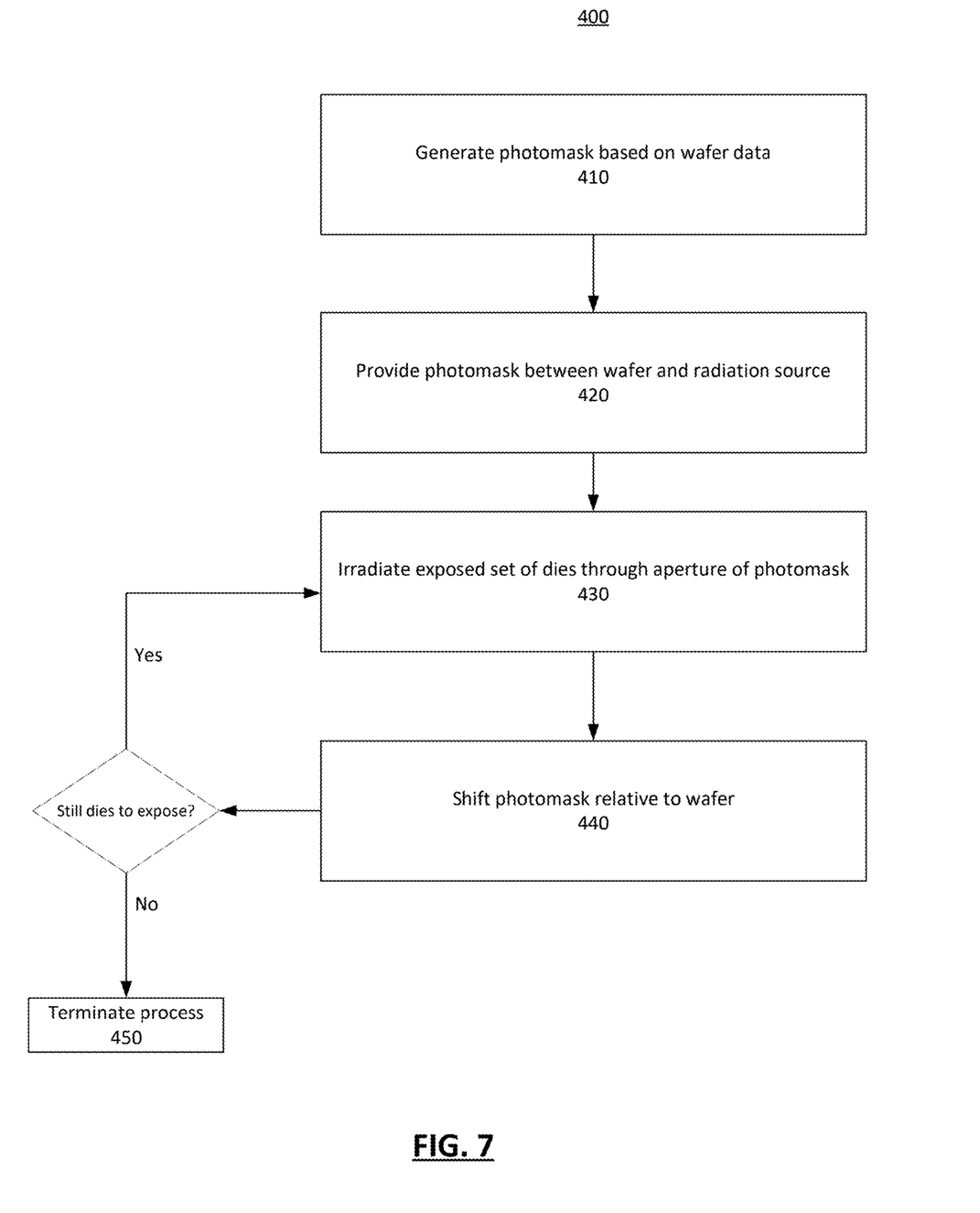
FIG. 7 is a flowchart of a method for exposing a wafer to a pattern of radiation according to one embodiment of the present disclosure.

FIG. 7 is a flow chart of a process 400 for wafer exposure, in accordance with some embodiments of the present disclosure. The process 400 begins with step 410 where a wafer shield, such as a photomask, is generated based on wafer data of a wafer. The wafer can be provided on a wafer stage.

The wafer data can include, but is not limited to, the dimensions of the wafer, a layout of the wafer, the size of the dies, exposure patterns of the dies. The photomask can include one or more opaque regions and one or more apertures. The process 400 then proceeds to step 420, wherein the photomask is provided between the wafer and a radiation source (e.g., a laser beam source). The photomask can be provided over the wafer and approximately parallel to and within a certain proximity to the wafer. The photomask can be fixed in place and may or may not be in contact with the wafer. In step 430, the wafer can be irradiated with a stepped laser beam. The laser beam can irradiate a first set of dies on the wafer that are exposed by apertures in the photomask. The laser beam can be stepped across the wafer. In step 440, the photomask can be displaced relative to the wafer by the wafer stage. The displacement of the photomask can result in the first set of dies being covered by the opaque regions of the photomask and a second set of dies being exposed by the transparent regions. The process 400 can repeat steps 430 and step 440 as needed to continue exposing dies. Each set of dies can be exposed by the photomask in step 440 and irradiated by the laser beam in step 430. In one embodiment, the process 400 can terminate at step 450 when all of the dies have been exposed and irradiated by the laser beam. In another embodiment, the process 400 can terminate before all of the dies have been exposed and irradiated by the laser beam based on the exposure dose needed for each die. In one embodiment, the process 400 can be executed prior to exposure of the wafer to photolithography radiation. In one embodiment, the process 400 can be executed after exposure of the wafer to photolithography radiation.

Isolating sets of dies on a wafer using a mask can enable adjustment of exposure dose across a single wafer in order to achieve the desired feature CDs of each die. The CDs can be varied across the wafer as well as across each die with high precision. In an embodiment, the bow of the wafer at the location of each die can be measured and known. The exposure dose can be adjusted for each die in order to control or correct the bow at the die, resulting in a more uniform wafer. The mask can be applied to the wafer before or after photolithography mask application or exposure.

The application of a photomask or the one or more mechanical blades to selectively cover and expose regions of a wafer for irradiation can be used to define regions of the wafer that are irradiated in a pre- or post-processing stop of photolithography. As a result, the regions can be efficiently and accurately exposed to a radiation dose. The mask can be used for precision patterning and to allow the radiation dose to be applied prior to a photolithography exposure process.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of processing a substrate, the method comprising:
    forming a photomask based on a layout of a first surface of a wafer, the photomask including at least one opaque region and at least one transparent region and the first surface of the wafer being coated with a photosensitive resist;
    providing the photomask at a first photomask location between the first surface of the wafer and a source of radiation at a predetermined wavelength, the at least one opaque region of the photomask covering a first region of the first surface of the wafer and the at least one transparent region of the photomask exposing a second region of the first surface of the wafer;
    exposing the first surface of wafer to a first pattern of radiation at the predetermined wavelength, the first pattern of radiation including the second region of the wafer exposed by the at least one transparent region of the photomask;
    displacing the photomask to a second photomask location between the first surface of the wafer and the source of radiation, the at least one transparent region of the photomask exposing a third region of the first surface of the wafer when the photomask is at the second photomask location; and
    exposing the first surface of the wafer to a second pattern of radiation at the predetermined wavelength, the second pattern of radiation including the third region of the wafer exposed by the at least one transparent region of the photomask at the second photomask location.

2. The method of claim 1, wherein forming the photomask further comprises forming the photomask based on a bow of the wafer.

3. The method of claim 1, wherein forming the photomask further comprises forming the photomask based on a bow of the wafer at the second region or the third region.

4. The method of claim 1, wherein the at least one transparent region includes two or more non-contiguous regions of the photomask.

5. The method of claim 1, wherein the first photomask location and the second photomask location are based on the layout of the first surface of the wafer.

6. The method of claim 1, wherein the source of radiation is a laser beam and the first pattern of radiation and the second pattern of radiation include a scan of the laser beam in discrete steps.

7. The method of claim 1, wherein the first pattern of radiation and the second pattern of radiation are the same.

8. The method of claim 1, wherein the first pattern of radiation includes a first exposure dose and a second exposure dose, the first exposure dose being greater than the second exposure dose.

9. The method of claim 1, wherein the first pattern of radiation or the second pattern of radiation include a repeating pattern of radiation.

10. The method of claim 1, wherein the second region of the first surface of the wafer and the third region of the first surface of the wafer are adjacent regions.

11. The method of claim 1, wherein, when the photomask is at the second photomask location, the at least one opaque region of the photomask covers the second region of the first surface of the wafer.

12. A method of processing a substrate, the method comprising:
providing one or more overlapping structures at a first location between a first surface of a wafer and a source of radiation at a predetermined wavelength, the one or more overlapping structures forming an aperture, the aperture exposing a first region of the first surface of the wafer and the first surface of the wafer being coated with a photosensitive resist;

exposing the first surface of the wafer to a first pattern of radiation at the predetermined wavelength, the first pattern of radiation including the first region of the first surface of the wafer;

displacing the one or more overlapping structures to a second location between the first surface of the wafer and the source of radiation, the aperture exposing a second region of the first surface of the wafer when the one or more overlapping structures are at the second location; and exposing the first surface of the wafer to a second pattern of radiation at the predetermined wavelength, the second pattern of radiation including the second region of the first surface of the wafer.

13. The method of claim 12, wherein the source of radiation is a laser beam and the first pattern of radiation and the second pattern of radiation include a scan of the laser beam in discrete steps.

14. The method of claim 12, wherein the first pattern of radiation and the second pattern of radiation are the same.

15. The method of claim 12, wherein the first pattern of radiation includes a first exposure dose and a second exposure dose, the first exposure dose being greater than the second exposure dose.

16. The method of claim 12, wherein the first pattern of radiation or the second pattern of radiation include a repeating pattern of radiation.

17. The method of claim 12, wherein a size of the aperture is based on a layout of the first surface of the wafer.

18. The method of claim 12, wherein the first location and the second location are based on a layout of the first surface of the wafer.

19. The method of claim 12, wherein the first region of the first surface of the wafer is covered by the one or more overlapping structures when the one or more overlapping structures are at the second location.

20. The method of claim 12, wherein the first region of the wafer and the second region of the wafer are adjacent.

* * * * *